US009159601B2

(12) United States Patent
Matsuzaki et al.

(10) Patent No.: US 9,159,601 B2
(45) Date of Patent: Oct. 13, 2015

(54) WORKPIECE TRANSFER APPARATUS

(75) Inventors: Yoshiyuki Matsuzaki, Osaka (JP); Kota Hoshijima, Osaka (JP); Haruo Maetani, Osaka (JP)

(73) Assignee: DAIHEN Corporation, Osaka (JP)

( * ) Notice: Subject to any disclaimer, the term of this patent is extended or adjusted under 35 U.S.C. 154(b) by 554 days.

(21) Appl. No.: 13/359,306

(22) Filed: Jan. 26, 2012

(65) Prior Publication Data

US 2012/0201641 A1    Aug. 9, 2012

(30) Foreign Application Priority Data

Feb. 4, 2011    (JP) ................... 2011-022404

(51) Int. Cl.
| | |
|---|---|
| *B25J 9/04* | (2006.01) |
| *H01L 21/677* | (2006.01) |
| *B25J 9/12* | (2006.01) |
| *B25J 11/00* | (2006.01) |
| *B25J 15/00* | (2006.01) |

(52) U.S. Cl.
CPC ........... *H01L 21/67766* (2013.01); *B25J 9/046* (2013.01); *B25J 9/126* (2013.01); *B25J 11/0095* (2013.01); *B25J 15/0014* (2013.01)

(58) Field of Classification Search
CPC ............. B25J 9/04; B25J 9/041; B25J 9/042; B25J 9/046; B25J 9/047; B25J 9/1055; B25J 9/12; B25J 9/123; B25J 9/126; B25J 9/14; B25J 9/142; B25J 9/144; B25J 9/146; B25J 11/0095; B25J 15/0014; B25J 17/025; B25J 17/0258; B25J 18/02; B25J 18/025; B25J 18/04; H01L 21/677; H01L 21/67703; H01L 21/67721; H01L 21/67739; H01L 21/67742; H01L 21/67766; H01L 2221/67; H01L 2221/683; Y10S 901/16; Y10S 901/17; Y10S 901/23

USPC ........... 74/490.02, 490.3, 490.05, 490.06; 414/226.05, 744.3, 744.5, 744.7, 806, 414/815, 918, 935, 941; 901/16, 17, 23
See application file for complete search history.

(56) References Cited

U.S. PATENT DOCUMENTS

| | | | | |
|---|---|---|---|---|
| 4,725,191 A | * | 2/1988 | Eberle et al. | 414/744.5 |
| 4,787,813 A | * | 11/1988 | Stevens et al. | 414/744.5 |
| 5,271,292 A | * | 12/1993 | Sawada et al. | 74/490.04 |
| 6,737,826 B2 | * | 5/2004 | Gilchrist | 318/568.21 |
| 6,781,337 B2 | | 8/2004 | Sakamoto et al. | |
| 6,893,204 B1 | * | 5/2005 | Suzuki et al. | 414/744.5 |

(Continued)

FOREIGN PATENT DOCUMENTS

| | | |
|---|---|---|
| JP | 61-252091 | 11/1986 |
| JP | 9-168985 | 6/1997 |

(Continued)

*Primary Examiner* — Saul Rodriguez
*Assistant Examiner* — Brendan Tighe
(74) *Attorney, Agent, or Firm* — Hamre, Schumann, Mueller & Larson, P.C.

(57) ABSTRACT

A workpiece transfer apparatus includes a stationary base, an elevation base, first and second arms, a workpiece-holding hand, and a driving mechanism for the hand. The first arm is supported on the elevation base so as to be rotatable about a first vertical axis. The second arm is supported on the distal end of the first arm such that the second arm is rotatable about a second vertical axis. The hand is supported on the distal end of the second arm so as to be rotatable about a third vertical axis. A motor is arranged in the first arm, whereas a transmission is arranged to extend in a region from the interior of the first arm through the interior of the second arm.

11 Claims, 7 Drawing Sheets

(56) References Cited

U.S. PATENT DOCUMENTS

| | | | |
|---|---|---|---|
| 8,573,919 B2 * | 11/2013 | Gilchrist et al. | 414/744.5 |
| 2007/0020081 A1 * | 1/2007 | Gilchrist et al. | 414/744.5 |
| 2011/0135437 A1 * | 6/2011 | Takeshita et al. | 414/744.5 |

FOREIGN PATENT DOCUMENTS

| | | |
|---|---|---|
| JP | 10-247674 | 9/1998 |
| JP | 2003-117877 | 4/2003 |
| JP | 2003-188231 | 7/2003 |

* cited by examiner

WORKPIECE TRANSFER APPARATUS

BACKGROUND OF THE INVENTION

1. Field of the Invention

The present invention relates to a workpiece transfer apparatus for transferring workpieces in the form of a thin plate. Specifically, the invention relates to a workpiece transfer apparatus for transferring e.g. wafers in the process of manufacturing semiconductor devices.

2. Description of the Related Art

In the manufacture of semiconductor devices, a robot for transferring workpieces such as wafers is used (see JP-A-2003-188231, for example). Such a workpiece transfer apparatus transfers workpieces between a load port storing wafers and a process chamber.

Figure 7:
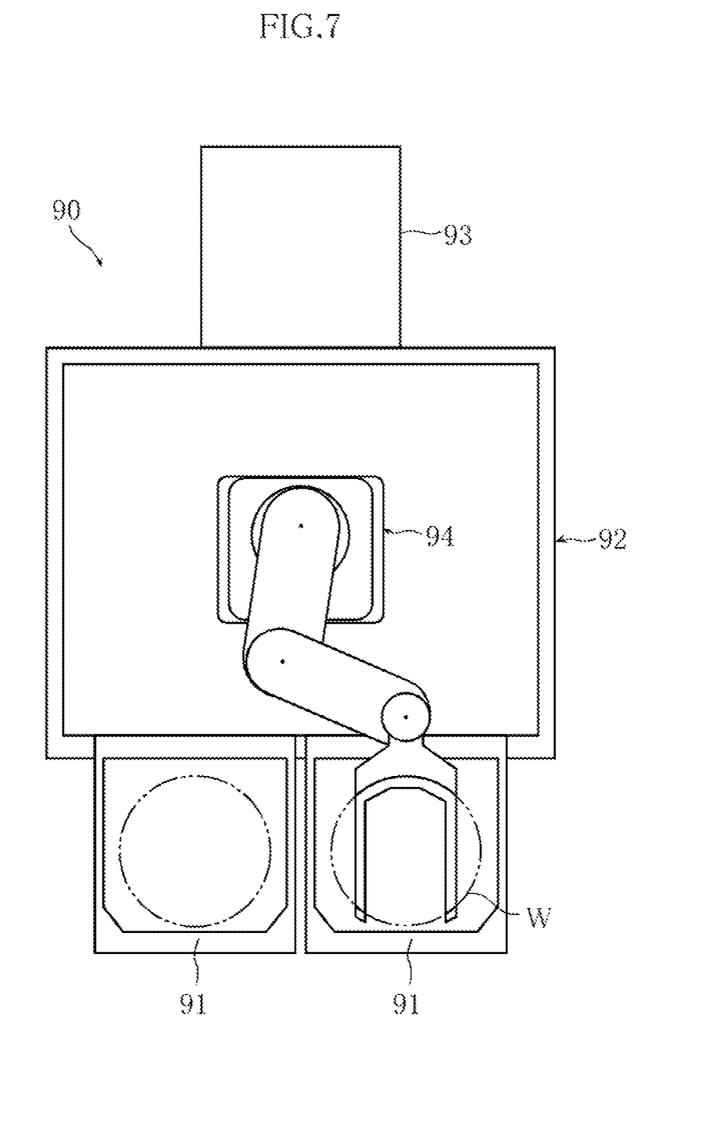
FIG. 7 is a plan view showing a conventional workpiece transfer system.

FIG. 7 shows an example of workpiece transfer system including a conventional workpiece transfer apparatus. The workpiece transfer system 90 illustrated in the figure includes two load ports 91, a transfer chamber 92, a process chamber 93 and a workpiece transfer apparatus 94. The workpiece transfer apparatus 94 comprises a horizontal articulated robot having the structure described below, and is arranged in the transfer chamber 92. On one side of the transfer chamber 92, the two load ports 91 are arranged side by side adjacent to the transfer chamber 92. Each of the load ports 91 accommodates a cassette for holding a plurality of workpieces W. On a side of the transfer chamber 92 opposite from the load ports 91, the process chamber 93 is arranged adjacent to the transfer chamber 92. In the process chamber 93, treatment such as heating, working, or testing is performed with respect to the workpieces W.

Figure 8:
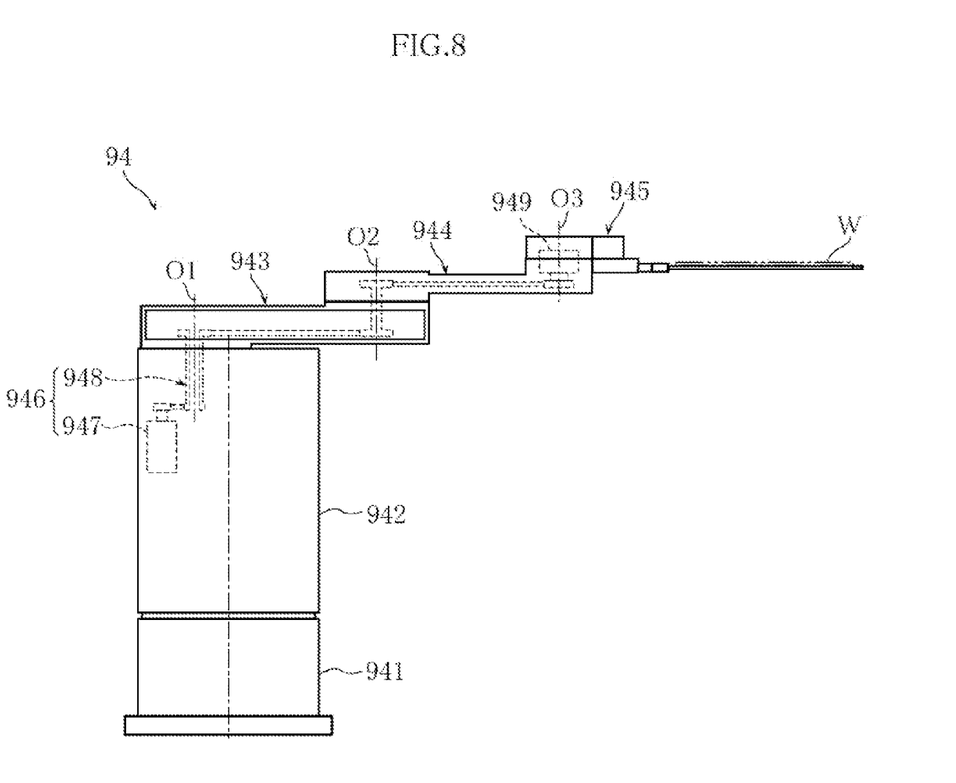
FIG. 8 is a side view showing an example of conventional workpiece transfer apparatus.

FIG. 8 is a side view showing a schematic structure of the workpiece transfer apparatus 94. The workpiece transfer apparatus 94 includes a hollow stationary base 941 having a vertically extending center axis, an elevation base 942, a lower arm 943, an upper arm 944 and a hand 945. The elevation base 942 is supported by the stationary base 941 and vertically movable by the operation of an elevation mechanism, not shown. The lower arm 943 is supported at its base end on the elevation base 942 and is rotatable around the vertical axis O1 by the operation of a lower arm driving mechanism, not shown. The upper arm 944 is supported at its base end on the distal end of the lower arm 943 and is rotatable around the vertical axis O2 by the operation of an upper arm driving mechanism, not shown.

The hand 945 is supported at its base end on the distal end of the upper arm 944 and is rotatable around the vertical axis O3 by the operation of a hand driving mechanism 946. The hand driving mechanism 946 includes a hand driving motor 947 supported by the elevation base 942 and a transmission mechanism 948 for transmitting rotational output of the motor 947 to the hand 945. The transmission mechanism 948 is provided with a speed reducer 949. The speed reducer 949 is arranged directly under the base end of the hand 945, and the base end of the hand 945 is connected to the output shaft of the speed reducer 949. With this arrangement, when the motor 947 is driven, the hand 945 rotates about the vertical axis O3.

In the workpiece transfer apparatus 94 having the above-described structure, workpieces W are transferred between each of the load ports 91 and the process chamber 93 by appropriately controlling the operation of the lower arm driving mechanism, the upper arm driving mechanism and the hand driving mechanism 946.

In recent years, the size of the workpieces W, which are the object to be transferred by the workpiece transfer apparatus 94, tends to increase. For instance, in the field of semiconductor device manufacture, wafers having a diameter of 450 mm and a relatively large thickness are expected to be used instead of the wafers having a diameter of 300 mm. Such an increase in diameter and thickness of the workpieces W leads to an increase in the transfer stroke of the workpieces W in horizontal and vertical directions.

In order that the transfer efficiency of the workpieces W does not decrease even when the transfer stroke in horizontal and vertical directions is increased, the transfer speed needs to be increased. However, with the conventional workpiece transfer apparatus 94 having the above-described structure, the hand driving motor 947 is arranged in the elevation base 942 so that the power transmission path from the motor 947 to the hand 945 is relatively long. This provides limitation on the increase in the workpiece transfer speed. As another means to increase the transfer speed, increasing the size of the motor 947 or the speed reducer 949 may be considered. With the above-described conventional structure, an increase in size of the motor 947 or the speed reducer 949 results in an increase in height of the work transfer apparatus 94, whereby the height of the hand 945 increases. Such an increase in height of the hand 945 is not desirable, because the lowest position where workpieces can be transferred in the load ports 91 cannot be changed in most cases due to various limitations. Thus, with the above-described conventional structure, it is difficult to achieve transfer of relatively large workpieces W at high speed by increasing the size of the motor 947 or the speed reducer 949.

A double-hand workpiece transfer apparatus including two hands arranged in the vertical direction is also known as an apparatus for realizing more efficient workpiece transfer. Such a double-hand workpiece transfer apparatus needs to include two motors and two transmission mechanisms. With the above-described conventional structure, however, the provision of two motors and two transmission mechanisms increases the height of the workpiece transfer apparatus 94 and hence increase the height of the hand 945, so that it is difficult to adapt such an apparatus for relatively large workpieces W.

SUMMARY OF THE INVENTION

The present invention has been proposed under the circumstances described above. It is therefore an object of the present invention to provide a workpiece transfer apparatus suitable for transferring workpieces at high speed, without increasing the height of the apparatus.

According to a first aspect of the present invention, there is provided a workpiece transfer apparatus comprising a stationary base, an elevation base vertically movably supported by the stationary base, a first arm and a second arm each of which includes a base end and a distal end, a hand for holding a workpiece, and a hand driving mechanism for driving the hand for rotation. The base end of the first arm is supported on the elevation base such that the first arm is rotatable about a first vertical axis. The base end of the second arm is supported on the distal end of the first arm such that the second arm is rotatable about a second vertical axis. The hand is supported on the distal end of the second arm such that the hand is rotatable about a third vertical axis. The hand driving mechanism includes a motor and a transmission mechanism for transmitting rotational output of the motor to the hand. The motor is arranged in the first arm, whereas the transmission mechanism is arranged to extend in a region from an interior of the first arm through an interior of the second arm.

According to a second aspect of the present invention, the transmission mechanism comprises a speed reducer for reducing rotation speed of the output shaft of the motor, an intermediate transmission shaft including a first end and a second end and arranged rotatably about the second vertical axis, an operation shaft including a first end and a second end and arranged rotatably about the third vertical axis, a first through a fourth pulleys, and a first and a second endless belts. The first pulley is attached to the output shaft of the speed reducer. The second pulley is attached to the first end of the intermediate transmission shaft. The first endless belt is wound around the first pulley and the second pulley. The third pulley is attached to the second end of the intermediate transmission shaft. The fourth pulley is attached to the first end of the operation shaft. The second endless belt is wound around the third pulley and the fourth pulley. The second end of the operation shaft is connected to the hand.

According to a third aspect of the present invention, in the workpiece transfer apparatus, the first arm includes a projecting portion projecting downward, and part of the transmission mechanism is arranged in the projecting portion.

According to a fourth aspect of the present invention, the workpiece transfer apparatus further comprises a wiring extending from the stationary base to the hand via the first and the second arms, and a slip ring arranged at a portion of the wiring.

According to a fifth aspect of the present invention, the workpiece transfer apparatus further comprising an additional hand for holding a workpiece, and an additional hand driving mechanism for driving the additional hand for rotation. The additional hand is supported on the distal end of the second arm such that the additional hand is rotatable about the third vertical axis. The additional hand driving mechanism includes an additional motor and an additional transmission mechanism for transmitting rotational output of the additional motor to the additional hand. The additional motor is arranged in the first arm, whereas the additional transmission mechanism is arranged to extend in a region from an interior of the first arm through an interior of the second arm.

According to a sixth aspect of the present invention, the workpiece transfer apparatus according to the second aspect further comprises an additional hand for holding a workpiece, and an additional hand driving mechanism for driving the additional hand for rotation. The additional hand is supported on the distal end of the second arm such that the additional hand is rotatable about the third vertical axis. The additional hand driving mechanism includes an additional motor and an additional transmission mechanism for transmitting rotational output of the additional motor to the additional hand. The additional motor is arranged in the first arm, whereas the additional transmission mechanism is arranged to extend in a region from an interior of the first arm through an interior of the second arm.

According to a seventh aspect of the present invention, in the workpiece transfer apparatus according to the sixth aspect, the additional transmission mechanism comprises an additional speed reducer for reducing rotation speed of an output shaft of the additional motor, an additional intermediate transmission shaft including a first end and a second end and arranged rotatably about the second vertical axis, an additional operation shaft including a first end and a second end and arranged rotatably about the third vertical axis, a first through a fourth additional pulleys, and a first and a second additional endless belts. The first additional pulley is attached to the output shaft of the additional speed reducer. The second additional pulley is attached to the first end of the additional intermediate transmission shaft. The first additional endless belt is wound around the first additional pulley and the second additional pulley. The third additional pulley is attached to the second end of the additional intermediate transmission shaft. The fourth additional pulley is attached to the first end of the additional operation shaft. The second additional endless belt is wound around the third additional pulley and the fourth additional pulley. The second end of the additional operation shaft is connected to the additional hand.

According to an eighth aspect of the present invention, in the workpiece transfer apparatus according to the fifth aspect, the first arm includes a projecting portion projecting downward, and part of the transmission mechanism and part of the additional transmission mechanism are arranged in the projecting portion.

According to a ninth aspect of the present invention, the workpiece transfer apparatus according to the fifth aspect further comprises a wiring extending from the stationary base to the hand and the additional hand via the first and the second arms, and a slip ring arranged at a portion of the wiring.

In the workpiece transfer apparatus according to the present invention, the motor for driving the hand and part of the transmission mechanism are arranged in the internal space of the first arm. With this arrangement, the height of the transmission mechanism within the distal end of the second arm is suppressed, and the total height of the stationary base and the elevation base is also suppressed. Further, since the transmission mechanism is arranged to extend in a region from an interior of the first arm through an interior of the second arm, the power transmission path from the motor to the hand is relatively short. This structure is suitable for workpiece transfer at high speed and with high accuracy. Moreover, since the speed reducer, which is one of the elements constituting the transmission mechanism, is arranged in the first arm, the rotation element operates stably. Thus, the workpiece transfer apparatus according to the present invention is capable of transferring even a relatively large workpiece at high speed and with high accuracy.

Other features and advantages of the present invention will become more apparent from detailed description given below with reference to the accompanying drawings.

DETAILED DESCRIPTION OF THE PREFERRED EMBODIMENTS

Preferred embodiments of the present invention are described below with reference to the accompanying drawings.

FIGS. 1-6 show a workpiece transfer apparatus according to an embodiment of the present invention. The workpiece transfer apparatus 10 of this embodiment is designed to transfer workpieces W in the form of a thin plate such as a wafer, and includes a stationary base 1, an elevation base 2, elongated lower arm 3 and upper arm 4, two hands 5A and 5B for holding a workpiece W, and a hand driving mechanisms 6A, 6B for driving the hands for rotation.

Figure 1:
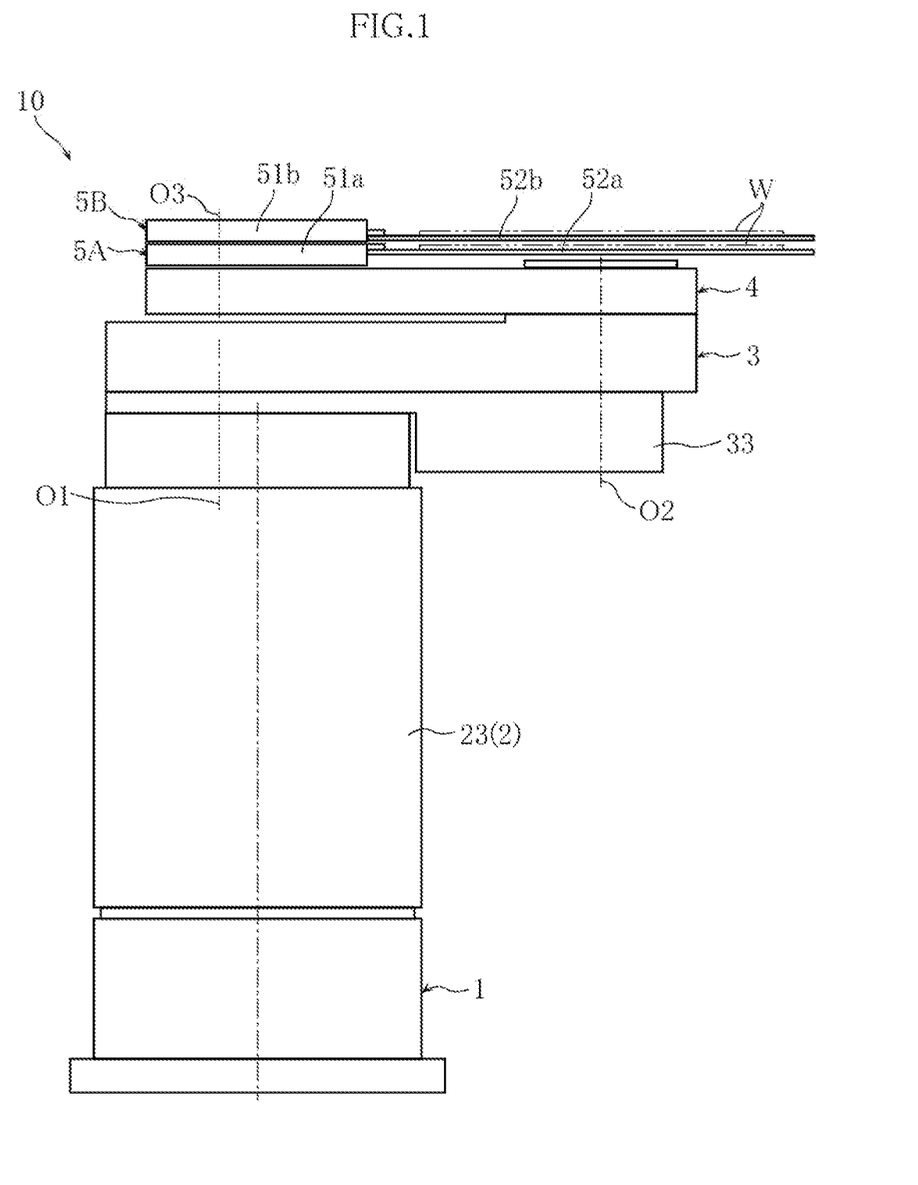
FIG. 1 is a side view showing an example of workpiece transfer apparatus according to the present invention.
Figure 2:
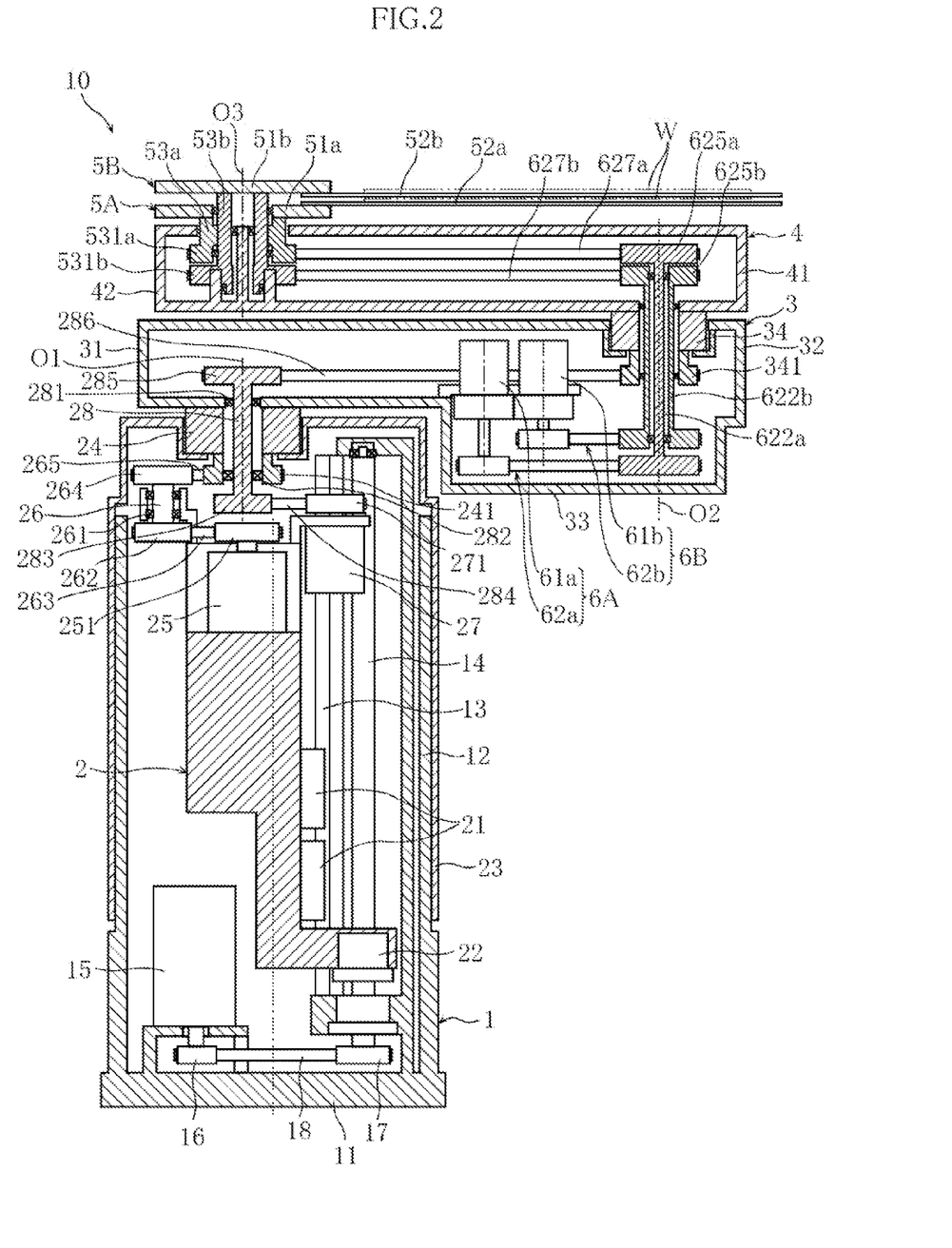
FIG. 2 is a sectional view showing the internal structure of the workpiece transfer apparatus.

As shown in FIG. 2, the stationary base 1 is structured as a hollow housing which is substantially rectangular in cross section and includes a bottom 11 and a side wall 12.

The elevation base 2 is supported by the stationary base 1 movably in the vertical direction. A pair of vertically extending guide rails 13 are provided in the stationary base 1. The elevation base 2 is provided with a slider 21. The slider 21 is supported on the guide rails 13 slidably in the vertical direction. A screw shaft 14 is rotatably supported in the stationary base 1. The elevation base 2 is further provided with a nut 22 threadingly engaging with the screw shaft 14. An elevation motor 15 is provided at a lower portion in the stationary base 1. A pulley 16 is attached to the output shaft of the elevation motor 15, whereas a pulley 17 is attached to the screw shaft 14. An endless belt 18 is wound around the pulleys 16 and 17. With this arrangement, when the elevation motor 15 is driven, the screw shat 14 rotates, and the elevation base 2 moves vertically in accordance with the rotation. In this way, the elevation mechanism for moving the elevation base 2 vertically relative to the stationary base 1 is provided.

The elevation base 2 is provided with an elevation cover 23 substantially rectangular in cross section and loosely fitted to the outer surface of the side wall 12 of the stationary base 1. The elevation cover 23 moves vertically along with the elevation base 2 and constantly covers an upper portion of the stationary base 1. The height of the elevation cover 23 is set such that a lower portion of the elevation cover 23 covers part of the side wall 12 even when the elevation base 2 is raised to the uppermost position.

A speed reducer 24 is provided at an upper portion of the elevation cover 23. The speed reducer 24 is one of the elements constituting a lower arm driving mechanism, which will be described later, and arranged to face the opening formed at an upper portion of the elevation cover 23. In this embodiment, a unit type speed reducer incorporating e.g. a cross roller bearing is used as the speed reducer 24. A speed reducer incorporating a cross roller bearing is used also as the speed reducers 34, 621$a$ and 621$b$, which will be described later.

As shown in FIG. 2, the lower arm 3 is substantially in the form of a hollow rectangular prism and supported at its base end 31 on the elevation base 2 such that its longitudinal direction corresponds to the horizontal direction. The lower arm 3 includes a projecting portion 33 projecting downward. The projecting portion 33 is provided toward the distal end of the lower arm 3 so as not to interfere with the elevation base 2 (elevation cover 23) when the lower arm 3 rotates about the vertical axis O1. (That is, the projecting portion 33 is spaced from the elevation cover 23 in the horizontal direction.) The base end 31 of the lower arm 3 has an opening at its lower portion, and the portion of the lower arm 3 around the opening is connected to the output shaft of the speed reducer 24. With this arrangement, the lower arm 3 is supported by the elevation base 2 via the speed reducer 24 rotatably about the vertical axis O1.

The elevation base 2 is provided with a lower arm driving motor 25. An intermediate transmission shaft 26 for the lower arm is provided at a position deviated from the vertical axis O1. The intermediate transmission shaft 26 is rotatably supported by the elevation base 2 via a bearing 261. A pulley 251 is attached to the output shaft of the motor 25, whereas a pulley 262 is attached to the lower end of the intermediate transmission shaft 26. An endless belt 263 is wound around the pulleys 251 and 262. A pulley 264 is attached to the upper end of the intermediate transmission shaft 26, whereas a pulley 241 is attached to the input shaft of the speed reducer 24. An endless belt 265 is wound around the pulleys 264 and 241. With this arrangement, when the lower arm driving motor 25 is driven, the lower arm 3 rotates about the vertical axis O1 due to the linked operation of the pulley 251, the endless belt 263, the pulley 262, the intermediate transmission shaft 26, the pulley 264, the endless belt 265, the pulley 241 and the speed reducer 24. In this way, the lower arm driving mechanism for rotating the lower arm 3 about the vertical axis O1 is provided.

A speed reducer 34 is provided at an upper portion of the distal end 32 of the lower arm 3. The speed reducer 34 is one of the elements constituting an upper arm driving mechanism, which will be described later, and arranged to face the opening formed at an upper portion of the distal end 32 of the lower arm 3.

The upper arm 4 is substantially in the form of a hollow rectangular prism and supported on the lower arm 3 such that its longitudinal direction corresponds to the horizontal direction. The base end 41 of the upper arm 4 has an opening at its lower portion, and the portion of the upper arm 4 around the opening is connected to the output shaft of the speed reducer 34. With this arrangement, the upper arm 4 is supported by the lower arm 3 via the speed reducer 34 rotatably about the vertical axis O2.

The elevation base 2 is further provided with an upper arm driving motor 27. An intermediate transmission shaft 28 for the upper arm is provided to penetrate through the hollow portion of the speed reducer 24. The intermediate transmission shaft 28 is connected to the lower portion of the base end 31 of the lower arm 3 via a bearing 281 and connected to the pulley 241 via a bearing 282. With this arrangement, the intermediate transmission shaft 28 is rotatable about the vertical axis O2. A pulley 271 is attached to the output shaft of the motor 27, whereas a pulley 283 is attached to the lower end of the intermediate transmission shaft 28. An endless belt 284 is wound around the pulleys 271 and 283. A pulley 285 is attached to the upper end of the intermediate transmission shaft 28, whereas a pulley 341 is attached to the input shaft of the speed reducer 34. An endless belt 286 is wound around the pulleys 285 and 341. With this arrangement, when the upper arm driving motor 27 is driven, the upper arm 4 rotates about the vertical axis O2 due to the linked operation of the pulley 271, the endless belt 284, the pulley 283, the intermediate transmission shaft 28, the pulley 285, the endless belt 286, the pulley 341 and the speed reducer 34. In this way, the upper arm driving mechanism for rotating the upper arm 4 about the vertical axis O2 is provided.

The hand 5A includes a base portion 51$a$ having a box-like shape, and a work holding portion 52$a$ having a bifurcated end. Similarly, the hand 5B includes a base portion 51$b$ having a box-like shape, and a work holding portion 52$b$ having a bifurcated end. The hands 5A and 5B are supported by the upper arm 4 such that their center axes extend in the horizontal direction.

A sensor for detecting a workpiece W is provided at appropriate portions of the hands 5A, 5B (work holding portions 52$a$, 52$b$). For instance, the sensor may be a reflective type photo interrupter.

Figure 3:
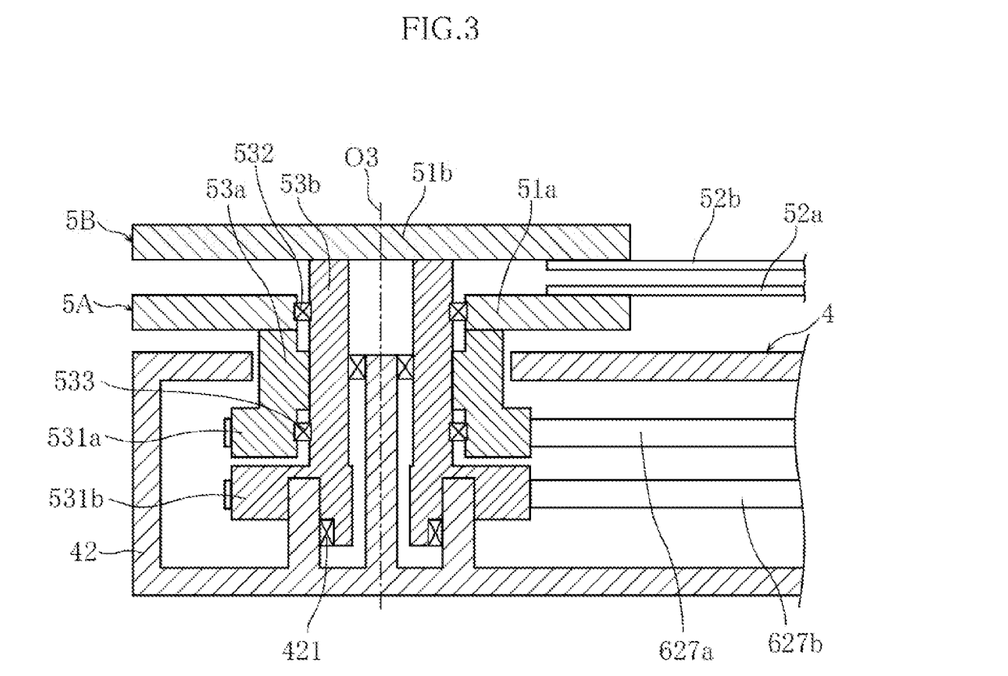
FIG. 3 is a sectional view showing the connection structure between the arm and the two hands.

A cylindrical operation shaft 53$a$ extending vertically downward is provided at the base portion 51$a$ of the hand 5A.

As shown in FIG. 3, the operation shaft 53a is fitted in an opening formed at an upper portion of the distal end 42 of the upper arm 4. The operation shaft 53a is rotatably supported by the upper arm 4 via a bearing 421. With this arrangement, the hand 5A is supported by the distal end 42 of the upper arm 4 rotatably about the vertical axis O3.

A cylindrical operation shaft 53b extending vertically downward is provided at the base portion 51b of the hand 5B. As shown in FIG. 3, the operation shaft 53b is arranged in the operation shaft 53a coaxially with the operation shaft 53a. The operation shaft 53b is connected to the base portion 51a of the hand 5A via a bearing 532 and connected to the operation shaft 53a via a bearing 533. With this arrangement, similarly to the hand 5A, the hand 5B is supported by the distal end 42 of the upper arm 4 rotatably about the vertical axis O3.

As shown in FIG. 2, the hand driving mechanism 6A includes a motor 61a for driving the hand 5A, and a transmission mechanism 62a for transmitting rotational output of the motor 61a to the hand 5A. Similarly, the hand driving mechanism 6B includes a motor 61b for driving the hand 5B, and a transmission mechanism 62b for transmitting rotational output of the motor 61b to the hand 5B.

The motors 61a and 61b are arranged in the lower arm 3, and the transmission mechanisms 62a and 62b are arranged to extend in a region from the interior of the lower arm 3 through the interior of the upper arm 4.

More specifically, the transmission mechanism 62a includes a speed reducer 621a (see FIG. 4) for reducing the rotation speed of the output shaft of the motor 61a, an intermediate transmission shaft 622a and the operation shaft 53a described above. Similarly, the transmission mechanism 62b includes a speed reducer 621b (see FIG. 4) for reducing the rotation speed of the output shaft of the motor 61b, an intermediate transmission shaft 622b and the operation shaft 53b described above.

Figure 4:
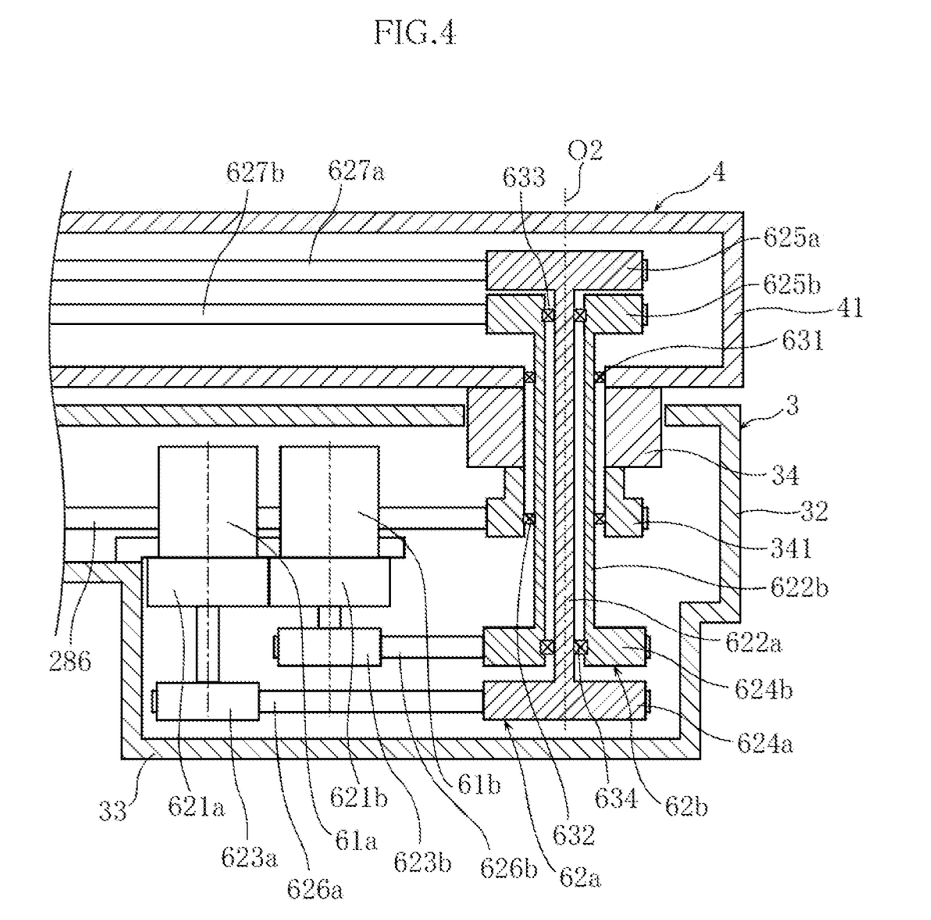
FIG. 4 is a sectional view showing the connection structure between the upper and the lower arms and its adjacent structure.

As shown in FIG. 4, the speed reducers 621a and 621b are arranged in the lower arm 3 and connected to the output shafts of the motors 61a and 61b, respectively. Pulleys 623a and 623b are attached to the output shafts of the speed reducers 621a and 621b, respectively.

As shown in FIG. 4, the intermediate transmission shafts 622a and 622b are arranged coaxially and extend through the hollow portion of the speed reducer 34 to be positioned in the distal end 32 of the lower arm 3 and in the base end 41 of the upper arm 4. The intermediate transmission shaft 622b is connected to a lower portion of the base end 41 of the upper arm 4 via a bearing 631 and connected to the pulley 341 via a bearing 632. The intermediate transmission shaft 622b is provided with a pulley 624b at its lower end and a pulley 625b at its upper end. The intermediate transmission shaft 622a is connected to the pulley 625b via a bearing 633 and connected to the pulley 624b via a bearing 634. The intermediate transmission shaft 622a is provided with a pulley 624a at its lower end and a pulley 625a at its upper end. The intermediate transmission shafts 622a and 622b are rotatable about the vertical axis O2.

As shown in FIGS. 2 and 3, the operation shaft 53a is provided with a pulley 531a at its lower end. The operation shaft 53b is provided with a pulley 531b at its lower end.

As shown in FIG. 4, an endless belt 626a is wound around the pulley 623a attached to the output shaft of the speed reducer 621a and the pulley 624a provided at the lower end of the intermediate transmission shaft 622a. An endless belt 626b is wound around the pulley 623b attached to the output shaft of the speed reducer 621b and the pulley 624b provided at the lower end of the intermediate transmission shaft 622b.

As shown in FIG. 2, an endless belt 627a is wound around the pulley 625a provided at the upper end of the intermediate transmission shaft 622a and the pulley 531a provided at the lower end of the operation shaft 53a. An endless belt 627b is wound around the pulley 625b provided at the upper end of the intermediate transmission shaft 622b and the pulley 531b provided at the lower end of the operation shaft 53b. With this arrangement, when the motor 61a is driven, the hand 5A rotates about the vertical axis O3 due to the linked operation of the speed reducer 621a, the pulley 623a, the endless belt 626a, the pulley 624a, the intermediate transmission shaft 622a, the pulley 625a, the endless belt 627a, the pulley 531a and the operation shaft 53a. Similarly, when the motor 61b is driven, the hand 5B rotates about the vertical axis O3 due to the linked operation of the speed reducer 621b, the pulley 623b, the endless belt 626b, the pulley 624b, the intermediate transmission shaft 622b, the pulley 625b, the endless belt 627b, the pulley 531b and the operation shaft 53b. In this way, the hand driving mechanisms 6A and 6B for rotating the hands 5A and 5B about the vertical axis O3 are provided.

The workpiece transfer apparatus 10 having the above-described structure ensures that the lower arm driving mechanism, the upper arm driving mechanism, the hand driving mechanism 6A and the hand driving mechanism 6B are controlled independently. Thus, the lower arm 3, the upper arm 4 and the hands 5A, 5B are rotated about the vertical axes O1, O2 and O3 within a predetermined range. By appropriately controlling the rotation of each of the lower arm 3, the upper arm 4, the hand 5A and the hand 5B, each of the hands 5A and 5B is moved to a desired position. Further, by driving the elevation motor 15, the elevation base 2 is moved up and down, whereby the hands 5A and 5B is moved to a desired height within a predetermined range.

If necessary, the clearances between the stationary base 1 and the elevation cover 23, between the elevation cover 23 and the lower arm 3, between the lower arm 3 and the upper arm 4, and between the upper arm 4 and the hands 5A, 5B may be closed with a sealing member. In this case, the inner space of the workpiece transfer apparatus 10 is hermetically sealed, so that undesired particles such as dust in the workpiece transfer apparatus 10 are prevented from diffusing to the surroundings.

The workpiece transfer apparatus 10 according to this embodiment includes a workpiece holding mechanism to hold a workpiece W on the hand 5A, 5B by utilizing vacuum suction.

The workpiece holding mechanism of this embodiment includes a vacuum pump provided in the stationary base 1 or the elevation base 2, vacuum suction ports provided in the hands 5A and 5B, and a conduit for connecting the vacuum pump and the vacuum suction ports. The conduit needs to be arranged so as not to prevent rotation of the lower arm 3, the upper arm 4 and the hands 5A, 5B. The conduit comprises pipe shafts extending along the vertical axes O1 and O2, pipes provided in the arms 3 and 4, an axial flow path extending along the vertical axis O3, and branch pipes provided in the hands 5A, 5B.

The end of the pipe shaft extending along the vertical axis O1, O2 and the pipe in the arm 3, 4 are connected to each other via an interconnection chamber provided in the arm 3, 4. The interconnection chamber and the end of the pipe shaft are hermetically connected rotatably relative to each other via e.g. an O-ring. Such a connection structure between the pipe shaft, the interconnection chamber and the pipe can be realized by a structure similar to that disclosed in JP-A-2003-188231 (See FIG. 7 of this document), and detailed description and illustration of this structure is omitted.

Figure 5:
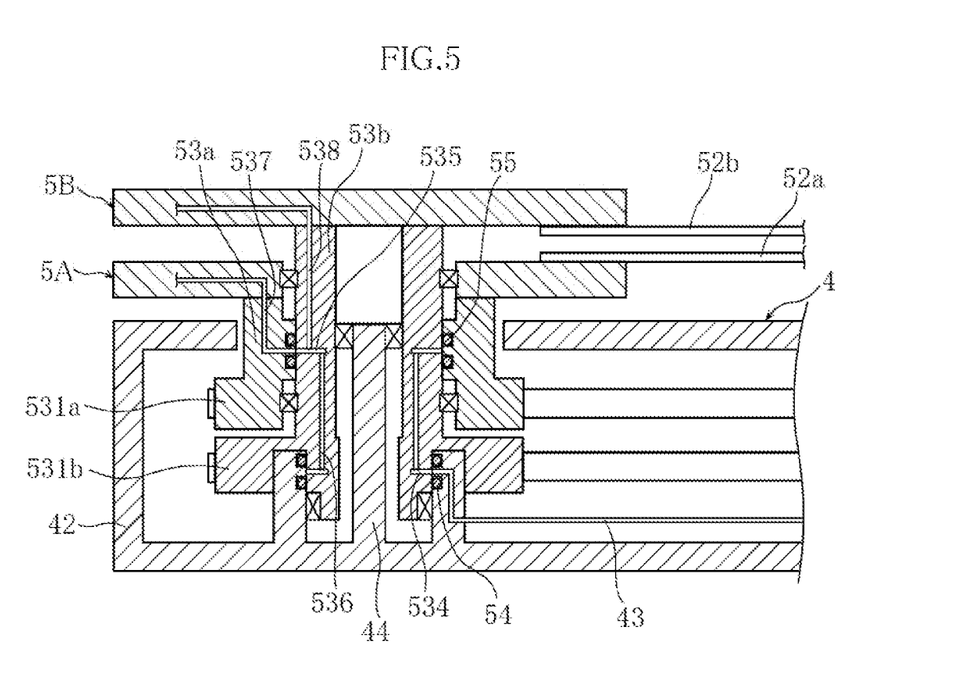
FIG. 5 is a sectional view showing the structure of a conduit for workpiece suction.

FIG. 5 shows a schematic structure of the conduit for the above-described workpiece suction provided in the upper arm 4 and the hands 5A, 5B. As shown in the figure, annular interconnection chambers 534 and 535 are provided in a lower portion and in a middle portion, respectively, of the operation shaft 53b of the hand 5B. The annular interconnection chamber 534 is connected to the pipe 43 in the upper arm 4. The annular interconnection chambers 534 and 535 are connected to each other via an axial flow path 536. A branch pipe 538 extending into the base portion 51b of the hand 5B is connected to the annular interconnection chamber 535. A branch pipe 537 extending into the base portion 51a of the hand 5A is provided in the operation shaft 53a of the hand 5A at a position corresponding to the annular interconnection chamber 535.

An O-ring 54 is interposed between the pipe 43 in the upper arm 4 and the annular interconnection chamber 534. Thus, the pipe 43 and the annular interconnection chamber 534 are hermetically connected rotatably relative to each other. An O-ring 55 is interposed between the annular interconnection chamber 535 and the branch pipe 537. Thus, the annular interconnection chamber 535 and the branch pipe 537 are hermetically connected rotatably relative to each other.

The branch pipe 537 of the hand 5A is provided with an electromagnetic valve (not shown) for opening or closing the branch pipe 537. The end of the branch pipe 537 is connected to a vacuum suction port (not shown) provided in e.g. the work holding portion 52a. The branch pipe 538 of the hand 5B is provided with an electromagnetic valve (not shown) for opening or closing the branch pipe 538. The end of the branch pipe 538 is connected to a vacuum suction port (not shown) provided in e.g. the work holding portion 52b.

With the workpiece holding mechanism including the above-described conduit, a workpiece W can be held by suction regardless of the rotational positional relationship among the lower arm 3, the upper arm 4 and the hands 5A, 5B. Moreover, by appropriately switching each of the electromagnetic valves provided in the branch pipes 537, 538 of the hands 5A, 5B, the two hands 5A and 5B are individually switched between a state in which the hand holds a workpiece W by suction and a state in which the hand does not hold a workpiece W by suction.

The workpiece transfer apparatus 10 according to the present invention includes a wiring for signal transmission relative to the sensor provided in the hands 5A, 5B and for power supply and signal transmission to the electromagnetic valves. The wiring extends from the stationary base 1 to the hands 5A and 5B via the elevation base 2, the lower arm 3 and the upper arm 4. The wiring may comprise a multicore such as a curl cord or a flat cable at portions between the stationary base 1 and the elevation base 2, between the elevation base 2 and the lower arm 3, and between the lower arm 3 and the upper arm 4, in order to accommodate changes in positional relationship.

Figure 6:
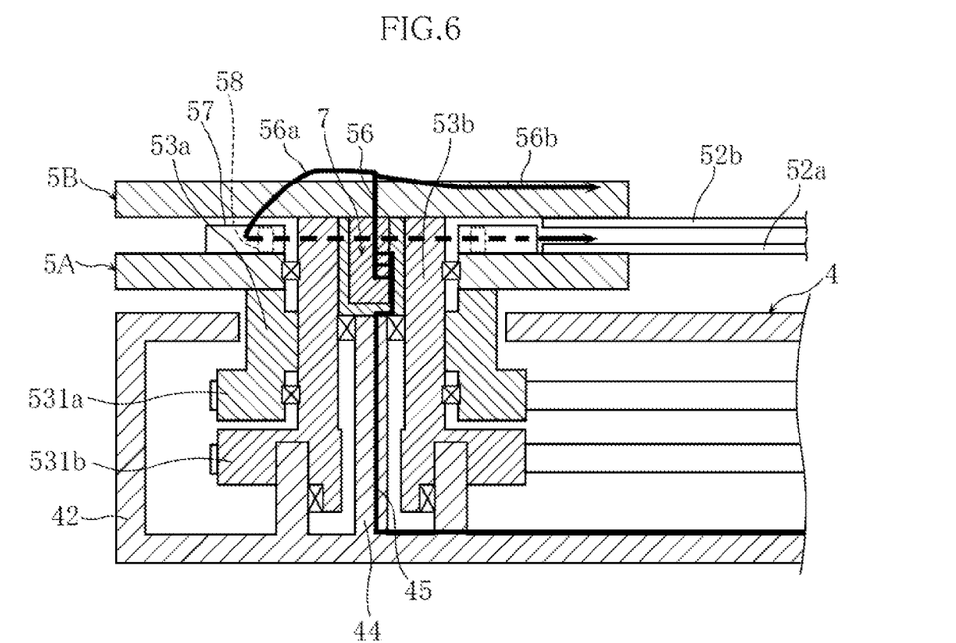
FIG. 6 is a sectional view showing the schematic structure of a wiring extending from the arm to the two hands.

FIG. 6 shows a schematic structure of the above-described wiring in the upper arm 4 and the hands 5A, 5B. As illustrated in the figure, the distal end 42 of the upper arm 4 includes a shaft portion 44 extending vertically upward from the bottom. The wiring includes an arm wiring portion 45 extending through axial portion 44 and a hand wiring portion 56 provided in the hands 5A, 5B.

A slip ring 7 is provided on the inner side of the operation shaft 53b of the hand 5B. The slip ring 7 is to provide electrical connection to a rotary member via an annular electric path and a brush, and the arm wiring portion 45 and the hand wiring portion 56 are connected to the annular electric path and the brush. With the slip ring 7, electrical connection between the arm wiring portion 45 and the hand wiring portion 56 is properly maintained while allowing endless relative rotation between the upper arm 4 and the hand 5B.

The hand wiring portion 56 includes a first wiring portion 56a for the hand 5A and a second wiring portion 56b for the hand 5B which are branched at a branch point. The first and the second wiring portions 56a and 56b are connected to the sensors and the electromagnetic valves described above. The first wiring portion 56a for the hand 5A comprises e.g. a flat cable in order to accommodate changes in positional relationship between the hands 5A and 5B due to rotation. The first wiring portion 56a needs to have a sufficient length to allow for relative rotation of the hands 5A and 5B. Herein, when the first wiring portion 56a comprises a flat cable, the first wiring portion 56a can be wound to overlap in the thickness direction around a winder portion 58 provided in a case 57 arranged on the hand 5A.

As noted above, the hand driving mechanisms 6A, 6B include motors 61a, 61b and transmission mechanisms 62a, 62b for transmitting rotational output of the motors 61a, 61b to the hands 5A, 5B. The motors 61a and 61b are arranged in the lower arm 3, and the transmission mechanisms 62a and 62b are arranged to extend in a region from the interior of the lower arm 3 through the interior of the upper arm 4. According to this structure, the motors 61a, 61b are arranged in the internal space of the lower arm 3 in a space-efficient manner. As compared with the conventional structure in which the motor is arranged in the stationary base 1 or the elevation base 2, the height of the stationary base 1 or the elevation base 2 is suppressed, whereby the height of the workpiece transfer apparatus 10 is suppressed.

Since the motors 61a, 61b and the transmission mechanisms 62a, 62b are arranged in the lower arm 3 or in the upper arm 4, the power transmission path from the motors 61a, 61b to the hands 5A, 5B is shorter than that in the conventional structure in which the motor is arranged in the stationary base 1 or the elevation base 2. Thus, the workpiece transfer apparatus 10 according to this embodiment is suitable for transferring workpieces at high speed.

According to the arrangement of the motors 61a, 61b in the lower arm 3, driving control of the hands 5A, 5B is easier than in the conventional structure in which the hand driving motor is arranged in the stationary base 1 or the elevation base 2. This is suitable for transferring workpieces at high speed and with high accuracy.

Moreover, since the speed reducers 621a, 621b are arranged adjacent to the motors 61a, 61b within the lower arm 3 in a space-efficient manner, the height of the hands 5A, 5B is suppressed as compared with the conventional structure in which the speed reducer for hand driving is arranged under the base end of the hand. This arrangement is also suitable for suppressing the height of the workpiece transfer apparatus 10.

The speed reducers 621a, 621b, which have a relatively large weight, are arranged not toward the distal end (i.e., adjacent to the hands 5A, 5B) but toward the base end (i.e., in the lower arm 3) of the rotation element (consisting of the lower arm 3, the upper arm 4 and the hands 5A, 5B). This arrangement ensures that the rotation element rotates more stably as compared with the conventional structure in which the speed reducer is arranged adjacent to the hand, which allows workpiece transfer with high accuracy.

As noted above, the lower arm 3 includes a projecting portion 33 projecting downward, and part of the transmission mechanisms 62a, 62b (the speed reducers 621a, 621b, pulleys 623a, 623b, pulleys 624a, 624b and endless belts 626a, 626b in this embodiment, as shown in FIG. 4) is arranged in the projection portion 33. With this arrangement, the transmission mechanisms 62a, 62b are arranged in the lower arm 3 in a space-efficient manner while keeping the height of the lower arm 3 substantially low. This is suitable for suppressing the height of the workpiece transfer apparatus 10.

The workpiece transfer apparatus 10 according to this embodiment is of a double-hand type with two hands 5A and 5B. According to the present invention, even a workpiece transfer apparatus of such a double-hand type can have a suppressed height by arranging the two motors and the two transmission mechanisms in the lower arm 3 or the upper arm 4 in a space-efficient manner.

According to this embodiment, the first wiring portion 56a for the hand 5A can be made of a flat cable and wound around the winder portion 58. With this arrangement, the height of the case 57 for accommodating the winder portion 58 will be sufficient if it is approximately equal to the width of the flat cable, so that the height of the hand 5B can be suppressed. Unlike this embodiment, when a curl cord is used as the first wiring portion 56a, the height of the case for accommodating the wiring needs to be larger to secure the movement area of the curl cord. Moreover, when a hollow slip ring is used as the first wiring portion 56a, the case for accommodating the slip ring needs to have a relatively large height because of the large outer dimension of the slip ring. Thus, the first wiring portion 56a comprising a flat cable is suitable for suppressing the height of the hand 5B, and hence, suitable for suppressing the height of the workpiece transfer apparatus 10.

As noted above, the workpiece transfer apparatus 10 according to this embodiment includes a workpiece holding mechanism utilizing vacuum suction, and the on state and the off state for holding a workpiece W by suction can be switched individually with respect to each of the hands 5A, 5B by the electromagnetic valves provided in the branch pipes 537, 538. Since the electromagnetic valves are arranged close to the work holding portions 52a, 52b where the vacuum suction ports are provided, excellent responsiveness is obtained with respect to the on-off switching of workpiece suction holing. This is suitable for transferring workpieces at high speed.

While the embodiment of the present invention has been described above, the technical scope of the present invention is not limited to the above-described embodiment. The specific structure of each part of the workpiece transfer apparatus according to the present invention can be modified in many ways without departing from the spirit of the invention.

Although a double-hand workpiece transfer apparatus including two hands 5A, 5B is described above as an example, the present invention is applicable also to a workpiece transfer apparatus including only one hand.

The invention claimed is:

1. A workpiece transfer apparatus comprising:
a stationary base;
an elevation base vertically movably supported by the stationary base;
a first arm and a second arm each of which includes a base end and a distal end;
a hand for holding a workpiece; and
a hand driving mechanism for driving the hand for rotation, wherein:
the base end of the first arm is supported on the elevation base such that the first arm is rotatable about a first vertical axis,
the base end of the second arm is supported on the distal end of the first arm such that the second arm is rotatable about a second vertical axis,
the hand is supported on the distal end of the second arm such that the hand is rotatable about a third vertical axis,
the hand driving mechanism includes a motor and a transmission mechanism for transmitting rotational output of the motor to the hand,
the motor is arranged in the first arm, and the transmission mechanism is arranged to extend in a region from an interior of the first arm through an interior of the second arm, and
wherein the transmission mechanism comprises:
a speed reducer for reducing rotation speed of an output shaft of the motor, the speed reducer being disposed right below the motor;
an intermediate transmission shaft including a first end and a second end and arranged rotatably about the second vertical axis;
an operation shaft including a first end and a second end and arranged rotatably about the third vertical axis;
a first through a fourth pulleys; and
a first and a second endless belts,
the first pulley being attached to an output shaft of the speed reducer, the second pulley being attached to the first end of the intermediate transmission shaft, the first endless belt being wound around the first pulley and the second pulley, the third pulley being attached to the second end of the intermediate transmission shaft, the fourth pulley being attached to the first end of the operation shaft, the second endless belt being wound around the third pulley and the fourth pulley, and the second end of the operation shaft being connected to the hand,
the first arm including a projecting portion projecting downward, wherein the first pulley, the second pulley and the first endless belt are arranged in the projecting portion.

2. The workpiece transfer apparatus according to claim 1, further comprising a wiring extending from the stationary base to the hand via the first and the second arms, and a slip ring arranged at a portion of the wiring.

3. The workpiece transfer apparatus according to claim 1, further comprising an additional hand for holding a workpiece, and an additional hand driving mechanism for driving the additional hand for rotation, wherein:
the additional hand is supported on the distal end of the second arm such that the additional hand is rotatable about the third vertical axis,
the additional hand driving mechanism includes an additional motor and an additional transmission mechanism for transmitting rotational output of the additional motor to the additional hand, and
the additional motor is arranged in the first arm, and the additional transmission mechanism is arranged to extend in a region from an interior of the first arm through an interior of the second arm.

4. The workpiece transfer apparatus according to claim 3, wherein the additional transmission mechanism comprises:
an additional speed reducer for reducing rotation speed of an output shaft of the additional motor;
an additional intermediate transmission shaft including a first end and a second end and arranged rotatably about the second vertical axis;
an additional operation shaft including a first end and a second end and arranged rotatably about the third vertical axis;
a first through a fourth additional pulleys; and
a first and a second additional endless belts;

the first additional pulley being attached to an output shaft of the additional speed reducer, the second additional pulley being attached to the first end of the additional intermediate transmission shaft, the first additional endless belt being wound around the first additional pulley and the second additional pulley, the third additional pulley being attached to the second end of the additional intermediate transmission shaft, the fourth additional pulley being attached to the first end of the additional operation shaft, the second additional endless belt being wound around the third additional pulley and the fourth additional pulley, and the second end of the additional operation shaft being connected to the additional hand.

5. The workpiece transfer apparatus according to claim 3, wherein part of the additional transmission mechanism is arranged in the projecting portion.

6. The workpiece transfer apparatus according to claim 3, further comprising a wiring extending from the stationary base to the hand and the additional hand via the first and the second arms, and a slip ring arranged at a portion of the wiring.

7. The workpiece transfer apparatus according to claim 1, wherein the projecting portion of the first arm is spaced apart from the elevation base as viewed in a direction parallel to the first vertical axis.

8. The workpiece transfer apparatus according to claim 7, wherein the elevation base includes an upper surface facing a part of the first arm, and the projecting portion of the first arm projects downward beyond the upper surface of the elevation base.

9. The workpiece transfer apparatus according to claim 5, wherein the projecting portion of the first arm is spaced apart from the elevation base as viewed in a direction parallel to the first vertical axis.

10. The workpiece transfer apparatus according to claim 9, wherein the elevation base includes an upper surface facing a part of the first arm, and the projecting portion of the first arm projects downward beyond the upper surface of the elevation base.

11. The workpiece transfer apparatus according to claim 1, wherein the motor is disposed at a position closer to the second vertical axis than the first vertical axis.

\* \* \* \* \*